US008509015B2

(12) United States Patent
Hold (10) Patent No.: US 8,509,015 B2
(45) Date of Patent: Aug. 13, 2013

(54) USING A PRECHARGE CHARACTERISTICS OF A NODE TO VALIDATE A PREVIOUS DATA/SIGNAL VALUE REPRESENTED BY A DISCHARGE OF SAID NODE

(75) Inventor: Betina K. M. Hold, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/328,007

(22) Filed: Dec. 16, 2011

(65) Prior Publication Data

US 2013/0155797 A1   Jun. 20, 2013

(51) Int. Cl.
*G11C 7/00*  (2006.01)
*G06F 11/00*  (2006.01)

(52) U.S. Cl.
USPC ...... 365/200; 365/203; 365/189.04; 365/207; 365/208; 714/798; 714/799; 714/811

(58) Field of Classification Search
USPC .................. 365/189.04, 200, 203, 207, 208; 714/798, 799, 811
See application file for complete search history.

(56) References Cited

U.S. PATENT DOCUMENTS

| 7,260,001 | B2 | 8/2007 | Bull |
| 2004/0223386 | A1 | 11/2004 | Mudge et al. |
| 2008/0120525 | A1* | 5/2008 | Agarwal ........................ 714/731 |
| 2010/0235697 | A1* | 9/2010 | Bull et al. ..................... 714/731 |
| 2011/0246843 | A1* | 10/2011 | Bull et al. ..................... 714/724 |

OTHER PUBLICATIONS

Austin et al., "Making Typical Silicon Matter with Razor", *IEEE Computer Society*, Mar. 2004, pp. 41-49.
Ernst et al., "Razor: A Low-Power Pipeline Based on Circuit-Level Timing Speculation", *36th Annual Int'l. Symposium on Microarchitecture (MICRO -36)*, Dec. 2003, 12 pages.

* cited by examiner

*Primary Examiner* — Hoai V Ho
*Assistant Examiner* — Jay Radke
(74) *Attorney, Agent, or Firm* — Nixon & Vanderhye P.C.

(57) ABSTRACT

An integrated circuit precharges a node 6 to a precharge voltage using precharging circuitry 4. During a discharge phase discharging circuitry 8 selectively discharges that node 6 is to represent a data/signal value. Sensing circuitry 10 detects a discharge characteristic to identify the data/signal value being represented. During the subsequent precharging operation of the node 6 back to the precharge voltage, validating circuitry 12 detects a precharge characteristic, such as the precharge current, the charge transferred, changes in the node voltage or a like, and compares this to the detected discharge characteristic corresponding to the data/signal value sensed by the sensing circuitry. If there is a mismatch, then an operation error signal is generated. The operation error signal may be used to adjust operation parameter, such as the operating voltage/frequency, the timing of the operation of a portion of the integrated circuit or another parameter.

27 Claims, 8 Drawing Sheets

USING A PRECHARGE CHARACTERISTICS OF A NODE TO VALIDATE A PREVIOUS DATA/SIGNAL VALUE REPRESENTED BY A DISCHARGE OF SAID NODE

BACKGROUND OF THE INVENTION

1. Field of the Invention

This invention relates to the field of data processing systems. More particularly, this invention relates to data processing systems which precharge a node and then discharge that node to represent a data value.

2. Description of the Prior Art

It is know to provide data processing systems which precharge a node and then discharge that node to represent a data value. One example of such a system is a memory in which bit lines running through an array of memory cells are precharged to a precharge voltage. A row of memory cells are then coupled to the bit lines and selectively discharged to the bit lines to represent the data values stored within the memory cells. Another example of a system which precharges a node then discharges that node to represent a data value is one employing domino logic. In domino logic a node is precharged to a precharge voltage then discharged in dependence upon the value of one or more input signals. Further examples of this type of system include signal lines which are used to pass signal values by precharging those signal lines to a precharge voltage and then selectively discharging those signal line to indicate a data value. Such signal lines may, for example, be used to pass signals through silicon vias between die layers of an integrated circuit formed of stacked dies or between integrated circuits using differential input/output signalling on a pair of signal lines.

A problem with such systems is that in order to speed up data processing it is desirable to read the data value from the node as rapidly as possible when the discharge of that node is still taking place, i.e. the node is only partially discharged. Thus, in many cases, such as memory bit lines, it is normal that the voltage of the node is not allowed to discharge completely before the data value is read. While this speeds up operation it introduces a problem of increasing the chances of an incorrect data value being read fro the node, for example, due to noise.

One way of dealing with this difficulty would be to resample the voltage at the node later during the discharge phase to ensure that it agrees with the initially read value. However, such re-sampling may result in the discharge phase having to last longer, thereby slowing operation, and may also require the duplication of some circuit elements needed to perform the sampling.

SUMMARY OF THE INVENTION

Viewed from one aspect the present invention provides an apparatus for processing data comprising:

discharging circuitry configured to selectively to discharge a node from a precharge voltage during a discharge phase to represent a data value;

precharging circuitry configured to precharge said node to said precharge voltage during a precharge phase;

sensing circuitry configured to detect during said discharge phase a discharge characteristic of said discharge to determine said data value; and validation circuitry configured to detect during said precharge phase a precharge characteristic of said precharge and to compare said discharge characteristic to said precharge characteristic to identify an operation error when said discharge characteristic does not match said precharge characteristic.

The present technique recognises that following the discharging of a node, the precharging of that node back to the precharge voltage will have characteristics which will be dependent upon the discharge characteristics that were used to determine the data value during the discharge phase. As an example, if the discharge characteristic sensed was that the node is substantially un-discharged, then the subsequent recharging will require very little current/charge to pass during the precharge phase. Conversely, if the node was significantly discharged during the discharge phase, then a larger current/charge will pass during the subsequent precharge phase. Thus, the discharge characteristic of substantially undischarged or discharged may be matched with the subsequent respective precharge characteristic of substantially no current/charge being required or a relatively large current/charge being required. Performing this validation of the data value read during the discharge phase using a precharge characteristic detected during the precharge phase has the advantage of not slowing the operation of the apparatus by requiring the discharge phase to be longer than would be desired. Furthermore, the detection of the precharge characteristic may be made without a requirement to duplicate circuitry for sensing a discharge characteristic. This technique provides an efficient way to support, for example, error detection, error recovery and circuit tuning for improved performance (e.g. tune operational parameters such as sense amplifier firing timing, voltage and/or frequency, running, checking for errors and then backing off or pushing forward depending upon whether errors are detected.

It will be appreciated that the node may take a variety of different forms. The node may, for example, be a signal line such as a bit line passing through an array of memory cells. It is also possible that the node may be a more compact node within domino logic evaluating a series of inputs to selectively discharge that node. Further examples include signal communication lines such as those passing through silicon vias or between integrated circuits as part of a system employing differential input/output signalling. A plurality of nodes may also be at least potentially discharged to represent a data/signal value.

When employed within a memory the discharge may be of a single node, such as a bit line in a single-ended memory, such as a ROM memory. Alternatively, the discharge may involve a plurality of nodes such as a bit line pair used to read a 6T memory cell memory or a plurality of a bit line pairs in a multiport memory.

The precharge characteristic which is detected may take a variety of different forms. The precharge characteristic may be a precharge current magnitude flowing to the node during the precharge phase, charge magnitude passing to the node during the precharge phase and/or a time taken for a voltage at the node to change by a predetermined amount during the precharge phase. It is possible that other characteristics of the precharge may also be used to validate the determination of the data value during the discharge phase. The precharge characteristic detected should have a correlation with the data value read during the discharge phase such that they can be matched.

It is not necessary that the discharge characteristic used in the discharge phase to determine the data value determined be the same characteristic which is used during the precharge phase as the precharge characteristic to validate that data value. As an example, voltage level of the node could be detected as the discharge characteristic and the current required during the precharge phase could be detected as the precharge characteristic. Other combinations of other discharge characteristic and precharge characteristic are also possible.

In embodiments of the present technique employing a plurality of bit lines then the precharge characteristic used may be a difference in precharge current flowing to the bit lines, a difference in charge magnitude passing to the bit lines and/or a difference in the time taken for a voltage at the bit lines to change by predetermined amount. Detecting differences between the precharge characteristics associated with a pair of bit lines may generally be more readily achieved than matching an absolute value of a sensed precharge characteristic against some predetermined value of that precharge characteristic.

When a mismatch occurs between the discharge characteristic and a precharge characteristic indicating that the data value was not read/evaluated correctly, operating parameter adjusting circuitry coupled to the validation circuitry may be used to change an operating parameter of the integrated circuit in response to the occurrence of the operation error.

The operating parameter can take a variety of different forms. In some embodiments the operating parameter may comprise at least one of an internal timing parameter of the integrated circuit, an operating voltage of the integrated circuit and/or an operating frequency of the integrated circuit. Changing an internal timing parameter of an integrated circuit has particular utility when applied to memory circuits which often include self-timed paths for triggering operations such as activating the amplifiers or initiating the precharge phase. Adjusting the timing of the self-timing paths to produce more reliable operation in response to detection of an operation error may improve the reliability of the circuit. As an example, the timing at which the amplifiers couple to the bit lines within a memory may be adjusted in dependence upon detected operation errors. An alternative/additional use of the error detection would be to correct the output at a delayed time which could be accepted in an appropriate pipelined architecture, e.g. a pipeline formed using the Razor techniques proposed by ARM Limited of Cambridge, England and described in WO-A-2004-084072. If there are no errors, the pipeline can be forced to run faster and if there are too many errors it may be slowed down.

Viewed from another aspect the present invention provides an apparatus for processing data comprising:

discharging means for selectively discharging a node from a precharge voltage during a discharge phase to represent a data value;

precharging means for precharging said node to said precharge voltage during a precharge phase;

sensing means for detecting during said discharge phase a discharge characteristic of said discharge to determine said data value; and validation means for detecting during said precharge phase a precharge characteristic of said precharge and for comparing said discharge characteristic with said precharge characteristic to identify an operation error when said discharge characteristic does not match said precharge characteristic.

Viewed from a further aspect the present invention provides a method of operating an apparatus for processing data comprising the steps of:

selectively discharging a node from a precharge voltage during a discharge phase to represent a data value;

precharging said node to said precharge voltage during a precharge phase;

detecting during said discharge phase a discharge characteristic of said discharge to determine said data value;

detecting during said precharge phase a precharge characteristic of said precharge; and comparing said discharge characteristic with said precharge characteristic to identify an operation error when said discharge characteristic does not match said precharge characteristic.

The above, and other objects, features and advantages of this invention will be apparent from the following detailed description of illustrative embodiments which is to be read in connection with the accompanying drawings.

DESCRIPTION OF THE EMBODIMENTS

Figure 1:
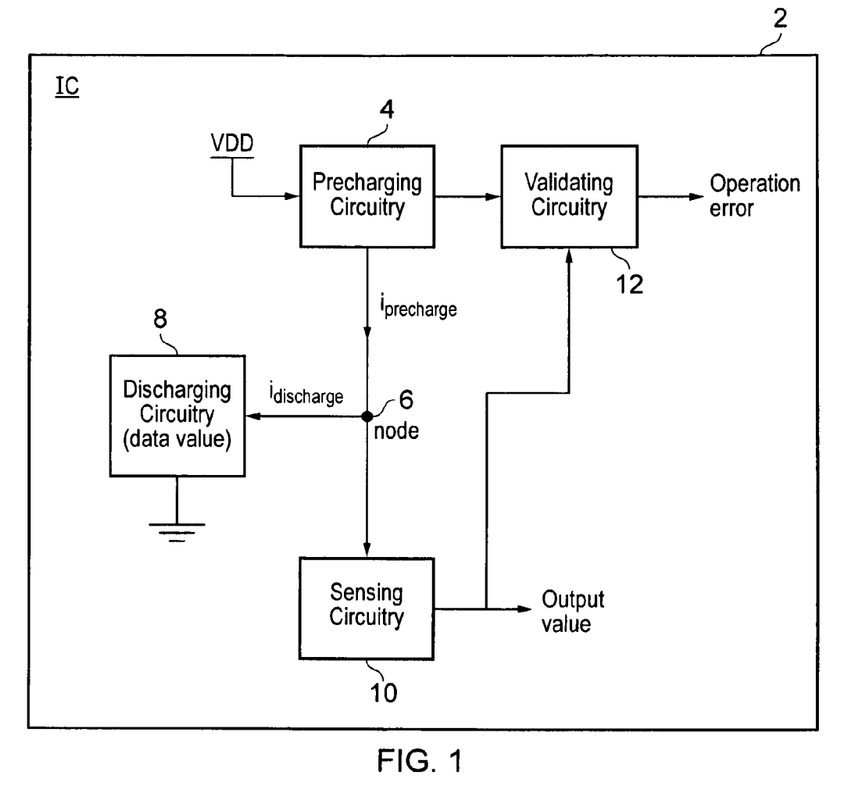
FIG. 1 schematically illustrates an integrated circuit having a node which is precharged and discharged.

FIG. 1 schematically illustrates an integrated circuit 2 including precharging circuitry 4 for charging a node 6 with a precharge current to a precharge voltage of VDD. Discharging circuitry 8 selectively discharges the node 6 during a discharge phase to represent a data value. Sensing circuitry 10 senses a discharge characteristic of the node 6 (such as a voltage at the node 6) to determine the data value represented at the node 6.

When the discharge phase has ended and the sensing circuitry 10 has detected the discharge characteristic, the precharging circuitry 4 starts another precharge phase with respect to the node 6. The precharging circuitry 4 supplies any necessary current/charge to the node 6 to bring node 6 back to the precharge voltage. Validating circuitry 12 coupled to the precharging circuitry 4 detects a precharge characteristic from the precharging circuitry 4. This precharge characteristic may, for example, be the one or a combination of a precharge current magnitude flowing to the node during the precharge phase, the charge magnitude passing to the node during the precharge phase and/or a time taken for a voltage at the node to change by predetermined amount during the precharge phase. If the node 6 was discharged during the discharge phase, then the current magnitude and charge magnitude as well as the time taken for the voltage to change by a predetermined amount will all be greater than if the node had not been significantly discharged by the discharge circuitry. The validating circuitry 12 is accordingly able to detect a precharge characteristic which is indicative of whether or not the node 6 was discharged during the discharge phase. The validating circuitry 12 also receives a signal corresponding to the output value from the sensing circuitry 10 and compares this to the detected precharge characteristic to determine if the discharge characteristic which was detected by the detecting circuitry 10 and used to generate the output value matches the precharge characteristic detected during the subsequent precharge phase.

The discharge characteristic detected by the sensing circuitry 10 may be different from the precharge characteristic detected by the validating circuitry 12. There is a correlation between detected discharge characteristics and what is expected to be the matching precharge characteristics which will be detected if the sensing circuitry correctly identified the discharge characteristic. Thus, a significant discharge of the voltage at the node 6 detected by the sensing circuitry 10 will validly be associated with a large magnitude current or a large magnitude charge passing to the node 6 from the precharging circuitry 4 during the subsequent charge phase.

The validity circuitry 12 generates an operation error signal if the detected precharge characteristic does not match the detecting discharge characteristic. This operation error signal may be used in a variety of different ways as will be discussed further below.

Figure 2:
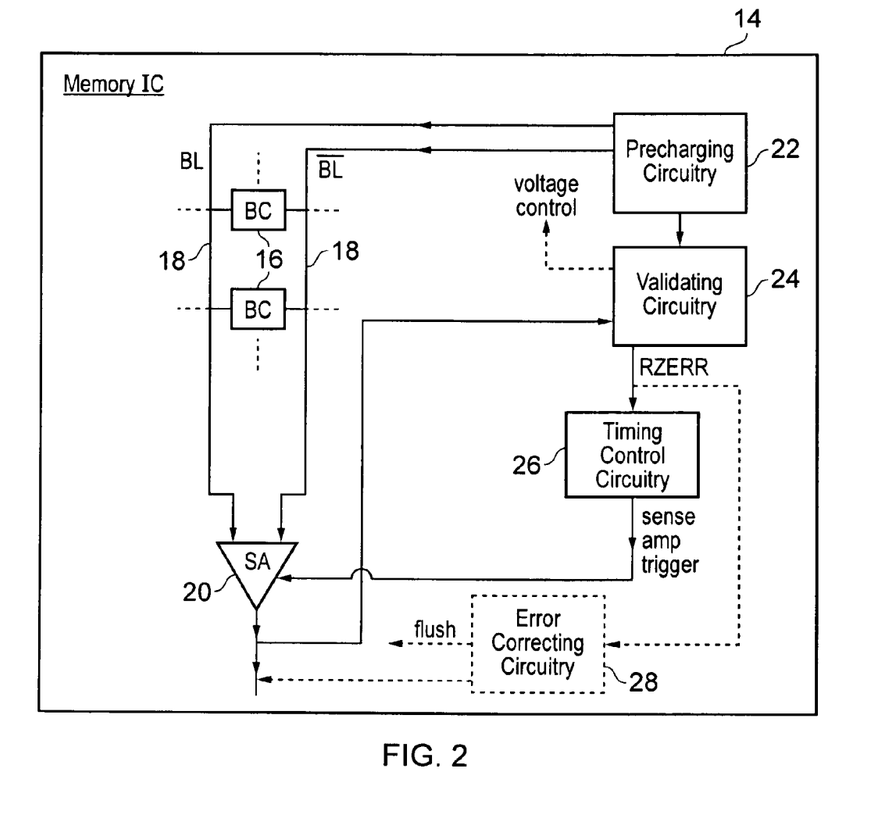
FIG. 2 schematically illustrates a memory integrated circuit employing bit line pairs which are precharged and discharged.

FIG. 2 schematically illustrates an integrated circuit memory 14 comprising an array of memory bit cells 16 coupled to respective bit line pairs 18. A sense amplifier 20 is used to detect the discharge of either of the bit lines of the bit line pair 18 dependent upon the data values stored within a selected row of bit cells 16 being read. Such an arrangement within a memory integrated circuit will be familiar to those in this technical field and will not be described further. The present techniques may also be applied to a memory with single ended sensing, such as a ROM.

The sense amplifier 20 corresponds to sensing circuitry serving to detect during a discharge phase a discharge characteristic to determine a data value. The bit lines 18 serve as a pair of nodes which are selectively discharged in dependence upon the data value. The data value is the bit value stored within the selected memory bit cell 16 and represented by the partial discharge of one of the bit lines 18.

Precharging circuitry 22 serves to precharge the bit lines 18 to a precharge voltage during a precharge phase. Validating circuitry 24 detects a precharge characteristic of the precharge operation performed by the precharging circuitry 22 subsequent to a read of data value via the bit lines 18. The precharge characteristic may be the precharging current drawn by the different bit lines 18, the charge flowing to the bit lines 18 and/or the time taken for the voltage on the bit lines 18 to change by a predetermined amount. In practice, the precharge circuitry 22 can measure currents, charges or voltages for both of the bit lines 18 and compare these measurements to determine a difference which forms the precharge characteristic. In the case of a single ended sensing ROM embodiment the bitline voltage may be compared to the precharge value (was any precharge required after the read).

As will be familiar to those in this technical field, when a memory cell is storing a bit value of "0" then one of the bit lines will be partially discharged upon a read while the other remains charged and conversely when the memory cell is storing a "1", then it is the other of the bit lines which is partially discharged while the former remains charged. This discharge characteristic is detected by the sense amplifier 20 as a voltage difference between the bit lines. The corresponding precharge characteristic will be that the bit line which was discharged will draw a larger current or charge or take a different amount of time to change voltage by a predetermined amount. Such a differential measurement may be more reliable. The precharge characteristic will indicate which of the two bit lines 18 was discharged. The validating circuitry 24 compares this precharge characteristic to the data value sensed by the sense amplifier 20 to determine that the data value output from the sense amplifier 20 corresponds to the same one of the bit lines 18 having been discharged.

If there is a mismatch between the discharge characteristic and the precharge characteristic, then an operation error signal is issued in the form of an RZERR signal supplied to timing control circuitry 26. The timing control circuitry 26 responds to the operation error signal by increasing the time delay between the bit lines 18 starting to be discharged as the bit cells 16 are accessed until the sense amplifier 20 is triggered to read the data value from the bit lines 18. Increasing this delay has the affect of allowing the longer period of time for the voltage on the nodes in the form of the bit lines 18 to fall as a consequence of a discharge through the memory bit cells 16 and accordingly result in a more reliable reading of the data value.

Shown in a dotted line form within FIG. 2 are optional further responses that can be made to the detection of an operation error. The validating circuitry 24 may generate a voltage control signal to increase the operating voltage of the memory integrated circuit 14 if an operational error is detected. Increasing the operation voltage will tend to increase the reliability of operation. The operation error signal may also trigger error correcting activity performed by error correcting circuitry 28. This error correcting circuitry 28 may substitute a corrected data value in place of the earlier read data value from the sense amplifier 20 which did not match the precharge characteristic. The error correcting circuitry 28 may also generate a flush signal which serves to flush any incorrect data processing operations which have been performed based upon the incorrect data value initially output by the sense amplifier 20.

The operating parameters that may be adjusted dependent on the operation error signal can have a variety of different forms. As discussed above, the timing of the operation of one or more elements within the circuit may be altered. It is also possible to alter the operating voltage and/or operating frequency of this circuitry (i.e upon occurrence of an operation error, increase the operating voltage and/or decrease the operating frequency (clock frequency)). Other responses to the operation error signal are also possible.

Figure 3:
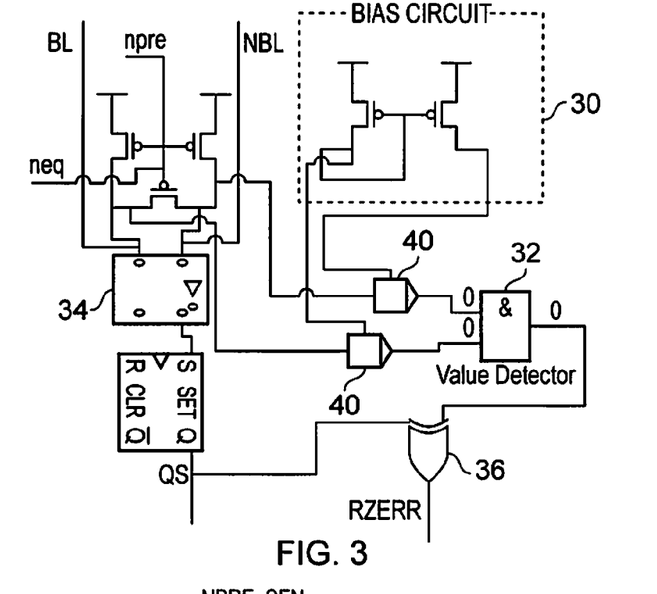
FIGS. 3, 4 and 5 illustrate a plurality of validation circuits which may be used to compare a data value read via a bit line pair with precharge characteristics detected during a subsequent precharge phase.

FIG. 3 schematically illustrates one form of validating circuitry that may be used in the context of a memory using bit line pairs. This circuit employs a current bias circuit 30 to compare the currents being used in the precharge phase to precharge the bit lines with the biased current. The results of the comparisons are supplied to value detector 32. This value detector 32 may operate to detect that only one bit line current during precharge met the biased current constraint. If this is the case, then that bit line corresponds to the "0" and its value is compared to the value read by the sense amplifiers 34 and output from the memory. This comparison is done by the gate 36. The value detector 32 may detect that both of amplifiers 40 produce different results and gate 36 may be used to check that their combined value indicates the same bit value being read as was read by the sense amplifier 34. If the value detector 32 detected that both or none of the bitlines met the current constraints, then this is also an error condition and the data read from the sense amplifiers 34 may not be correct, e.g. there was too little time for either bitline to discharge to any significant degree or both bit lines discharged due to one being leaky.

Advantages of this example embodiment of FIG. 3 are that it does not significantly load the bit lines during the normal sensing operation during the discharge phase. Accordingly, the validation checking does not significantly extend the cycle time of the normal read operation. The validation checking does not require a duplicate sense amplifier in the normal read path and does not rely upon an edge detector circuit which may be complex to provide. At an overall level, the circuitry of FIG. 3 uses the existing memory reading circuitry with some added on circuitry to measure the behaviour of the precharging operation and compare that behaviour to the data value which was read during the discharge phase.

Figure 4:
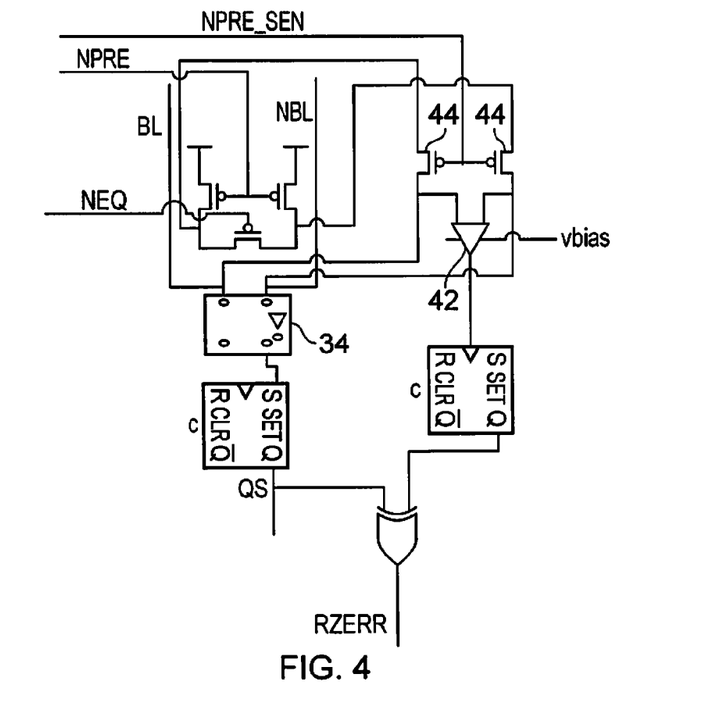

FIG. 4 illustrates an alternative embodiment. In this embodiment a small amplifier 42 is placed in line with the precharge devices 44 to compare the precharge currents. If the results of this comparison are that one of the precharge currents is detected as being larger than the other then it is probable the sense amplifier 34 was supplied with enough voltage differential and had enough time to sense this. This detected difference is the precharge characteristic which is compared to the data value read during the discharge phase. The larger precharge current should correspond to the bit line which was discharged as indicated by the data value which was read during the discharge phase. If this condition is not met, then an operation error is indicated. If the precharge currents are the same, then this indicates an error.

Figure 5:
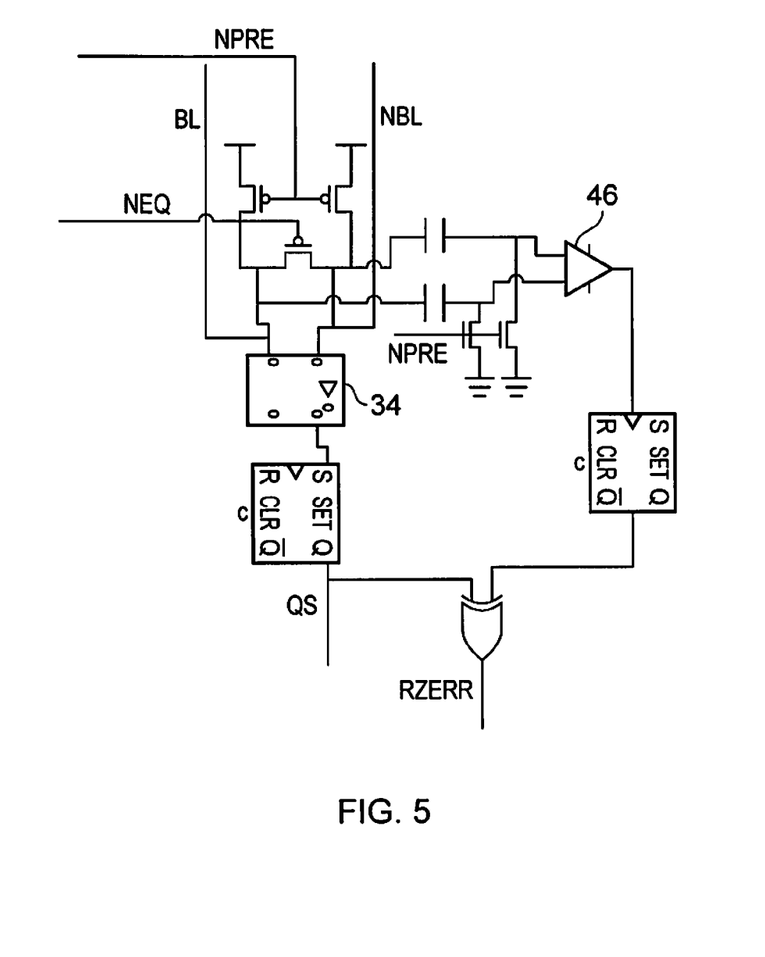

FIG. 5 schematically illustrates another example embodiment. In this example embodiment the precharge voltage restore value of the bit lines is converted into a voltage value which is then fed into an amplifier 46. This amplifier 46 compares the two voltage values it receives. One of these voltage values should be higher than the other corresponding to the bit line which was not discharged. This is the detected precharge characteristic which is compared to the discharge characteristic, namely the data value which was read.

Other embodiments may serve to measure the magnitude of the current passed to the bit lines during the precharge phase. Charge reservoirs could be used to store the charge which is then supplied during the precharge phase. The amount of charge supplied may be measured by measuring a voltage strop at the reservoir. Other mechanisms for measuring the magnitude of the charges supplied during precharge phase may also be employed.

Figure 6:
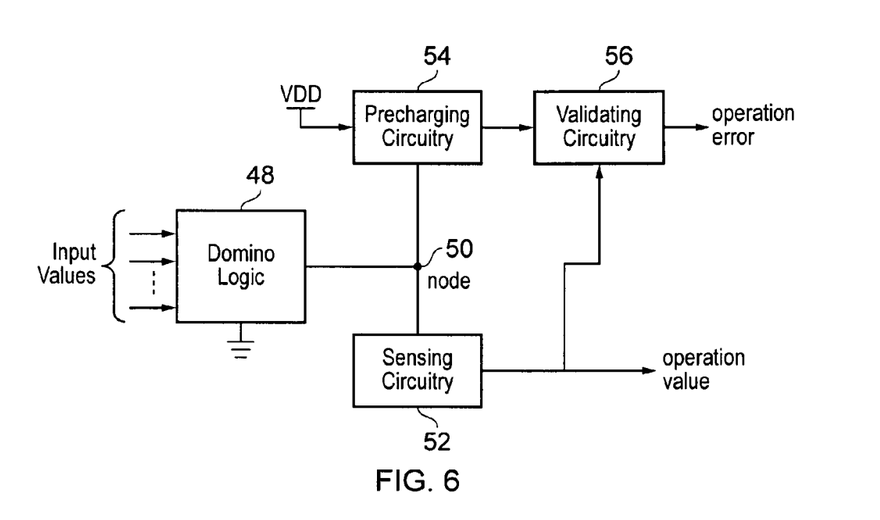
FIG. 6 schematically illustrates domino logic which precharges and discharges a node in dependence upon a plurality of input values.

FIG. 6 schematically illustrates the application of the present technique to a system employing domino logic 48. The domino logic 48 evaluates a plurality of received input signals and then selectively discharges a node 50 dependent upon the result evaluated from those input signals. Sensing circuitry 52 detects a voltage drop (discharge characteristic) of the node 50 following this discharge phase. This discharge characteristic may be whether or not the precharge voltage at the node 50 has fallen (i.e. the charge held at the node 50 has been at least partially discharged to ground through the domino logic 5848). The sensing circuitry 52 generates an output value in dependence upon this detected discharge characteristic to correspond to the signal value represented by the discharge characteristic.

Precharging circuitry 54 precharges the node 50 back to the precharge voltage during a precharge phase. Validating circuitry 56 detects a precharge characteristic of the precharging operation performed during there precharged phase. This precharge characteristic is compared to the output value form the sensing circuitry 52 to check that they match. If there is a mismatch, then an operation error signal is generated.

Figure 7:
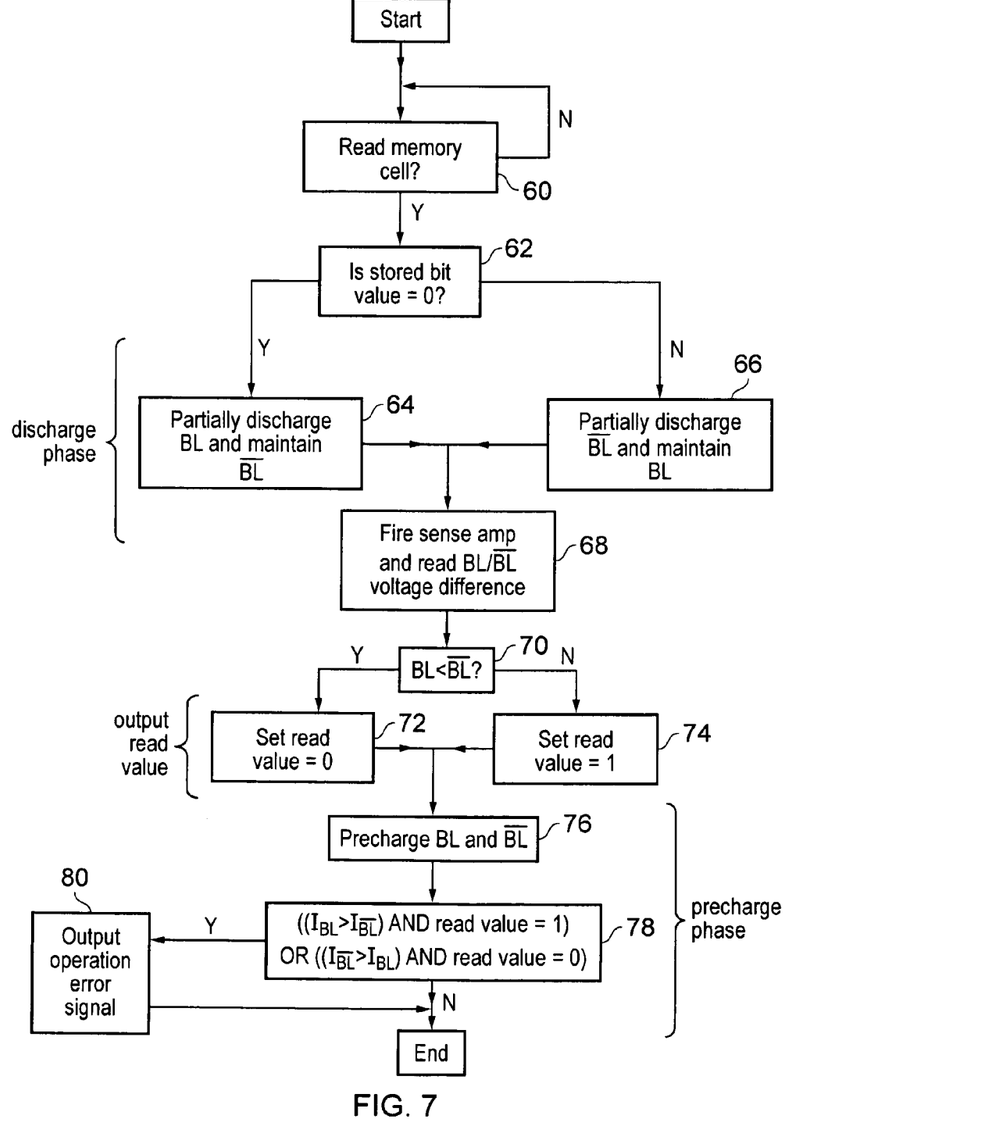
FIG. 7 is a flow diagram schematically illustrating the operation of the memory integrated circuit of FIG. 2.

FIG. 7 is a flow diagram schematically illustrating the operation of the memory circuitry of FIG. 2. At step 60 processing waits until the bit lines are precharged and a memory cell is to be read. Step 62 determines whether or not the stored bit value within the memory cell is a "0". If the stored bit value is a "0", then step 64 partially discharges the bit line BL and maintains the voltage on the bit line $\overline{BL}$. Conversely, the determination at step 62 is that the stored bit value is "1", then step 66 partially discharges the bit line $\overline{BL}$ and substantially maintains the voltage on the bit line BL.

At step 68, the sense amplifiers are fired to read the voltage difference between the two bit lines. Step 70 determines whether or not the voltage on the bit line BL is less than the voltage on the bit line $\overline{BL}$. If the voltage on the bit line BL is less, then step 72 sets the data value read from the memory cell as "0" and this is output from the memory. Conversely, if the voltage on the bit line BL is not lower than the voltage on the bit line $\overline{BL}$, then step 74 sets the data value read from the memory cell to be "1" and this is output from the memory.

It will be seen that the steps 64 and 66 which are performed in the alternative comprise part of the discharge phase of operation of the memory circuitry. The steps 62 and 64, which are performed in the alternative, serve to read the data value from the memory cell. Subsequent to steps 62, 64 and 66, step 76 serves to precharge the two bit lines. Step 78 then determines whether the precharge current for the bit line BL is greater than that for the bit line $\overline{BL}$ and the read value is "1" as this would indicate a mismatch and accordingly trigger an activated output of an output error at step 80. As an alternative, step 78 also determines whether or not the precharged current for the bit line $\overline{BL}$ is greater than that for the bit line BL and that the read value is "0" as this also indicates a mismatch and should trigger output of the activated operation error signal at step 80. If step 78 does not indicate any mismatch detected during the precharge phase, then step 80 is bypassed and the precharge phase is completed without the generation of an activated operation error signal. The operation error signal of step 80 may be used to delay the firing of the sense amplifiers or to trigger adjustment of some other operating parameter.

Figure 8:
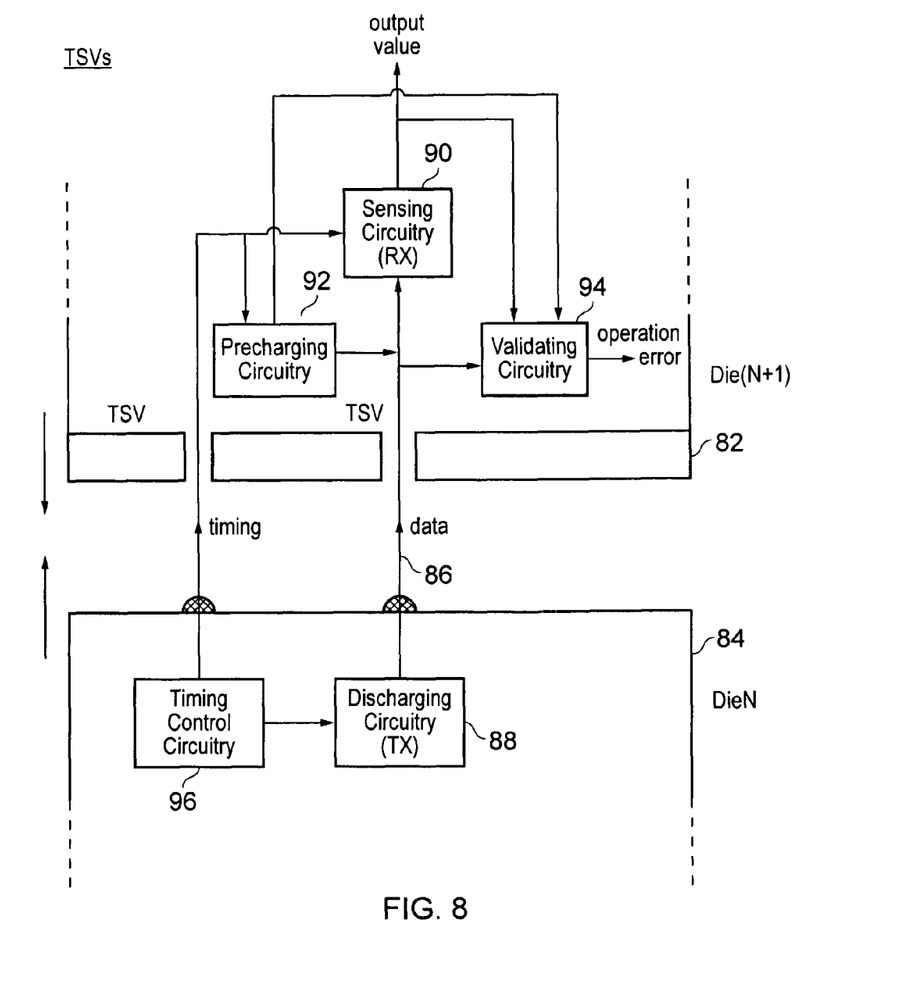
FIG. 8 schematically illustrates the use of the present technique in the context through silicon vias.

FIG. 8 schematically illustrates the application of the present technique to another type of circuit. In this circuit through silicon vias (TSVs) are provided through a die 82 which is stacked on a die 84. A signal line 86 passing through a through silicon via between the dies 82, 84 serves as a node permitting a data value to be passed from a die 84 to die 82. Discharging circuitry 88 within the die 84 serves to selectively discharge the signal line 86 in dependence upon the data value to be passed. Sensing circuitry 90 within the die 82 senses a discharge characteristic of the signal line 86 and generates an output value in dependence upon that detected discharge characteristic.

Recharging circuitry 92 then precharges the signal line 86 back to a precharge voltage. A precharge characteristic associated with this precharging phase is detected and compared to the output value read from the signal line 86 by validating circuitry 94. If there is a mismatch, then an operation error signal generated. Timing control circuitry 96 within the die 84 passes a timing signal through it's own through silicon via to control the timing of the operation of the sensing circuitry 90 and the precharging circuitry 92. In this example, the discharging circuitry 88 serves as a transmitter and the sensing circuitry 90 serves as a receiver in a signal passed through a through silicon vias to provide inter-die communication within a stacked integrated circuit.

Figure 9:
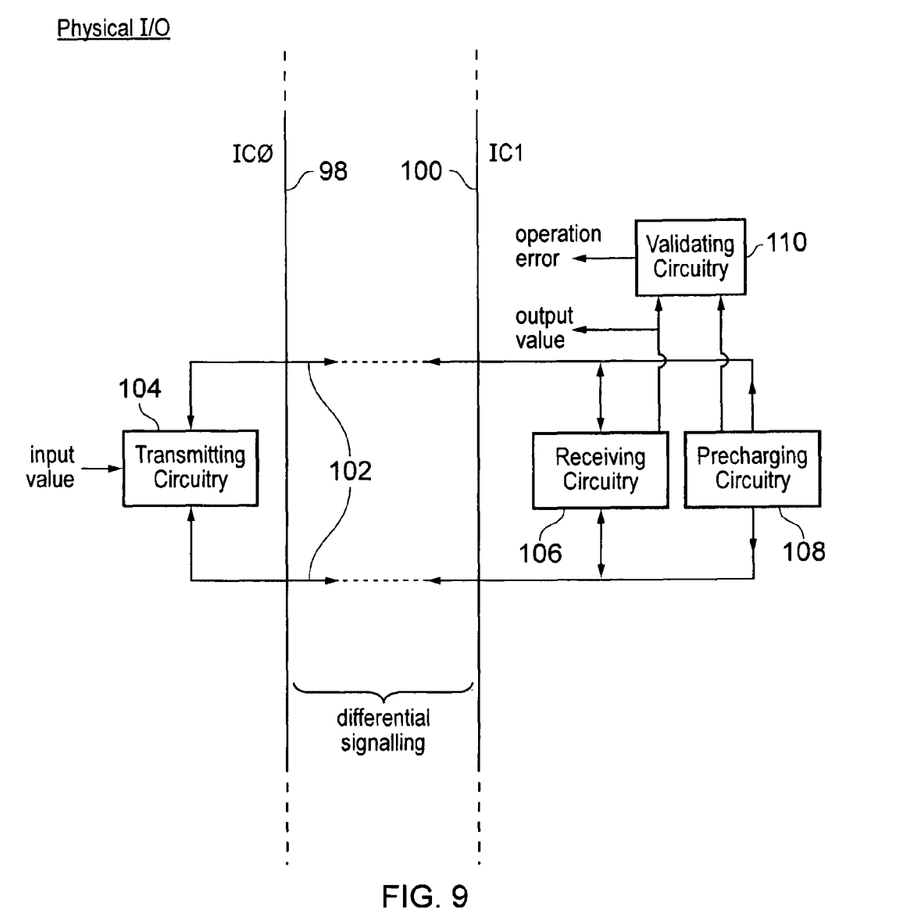
FIG. 9 schematically illustrates the use of the present technique in the context of physical input/output signalling between integrated circuits.

FIG. 9 schematically illustrates another example of embodiment. In this example embodiment two separate integrated circuits 98, 100 are provided and communicate with each other through differential signalling applied upon signal lines 102. Transmitting circuitry 104 serves in the role of discharging circuitry and selectively discharges one of the signal lines 102 dependent upon a received input value which is to be passed from integrated circuit 98 to integrated circuit 100.

Within integrated circuit 100, receiving circuitry 106 serves as sensing circuitry to detect a discharge characteristic of the nodes which are in the form of the signal lines 102. The detected discharge characteristic is used to determine an output value corresponding to the input value received at a transmitting circuitry 104, precharging circuitry 108 then precharges the signal lines 106 back to their precharge values. A precharging characteristic associated with this precharging phase is detected by validating circuitry 110 and compared to the output value generated by the receiving circuitry 106. If there is a mismatch, then an activated operation error signal is generated. The signalling between the integrated circuits 98 and 100 is in the form of physical input/output signalling performed on a differential basis by using a difference in voltage between the signal lines 102 established by at least partially discharging one of those signal lines during a discharge phase. It will be appreciated that control and timing need to be co-ordinated between the integrated circuits so that the discharging and precharging align. In accordance with known signalling techniques, the timing of the data transfer may be self-timed using clocks generated by detecting edges within the data signals being passed between the integrated circuits 98, 100. Other embodiments may use separate control and timing signals/lines.

The above described technique has been described in relation to a plurality of different embodiments. It will be appreciated that in the present technique is not limited to these example embodiments and may be employed in other circuits where there is a discharge of a node to represent a data value followed by a precharging of that node back to a precharge voltage for the nest discharge/precharge cycle. A detected discharge characteristic of the node may be compared to a detected precharge characteristic to validate that the data/signal value detected as being represented by the discharge characteristic matches the subsequent precharge characteristic. This may improve read reliability without having to undesirably increase the duration of the discharge phase. The validation may also be performed with relatively low additional circuit overhead. The node which is discharged may take a variety of different forms and may comprise node pairs or further combinations of nodes that are selectively charged to represent a data/signal value. The nodes may comprise localised points or areas within a circuit or an integrated circuit or alternatively may comprise more extended signal lines.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the apended claims.

I claim:

1. Apparatus for processing data comprising:
   discharging circuitry configured selectively to discharge a node from a precharge voltage during a discharge phase to represent a data value;
   precharging circuitry configured to precharge said node to said precharge voltage during a precharge phase;
   sensing circuitry configured to detect during said discharge phase a discharge characteristic of said discharge to determine said data value; and
   validation circuitry configured to detect during said precharge phase a precharge characteristic of said precharge and to compare said discharge characteristic to said precharge characteristic to identify an operation error when said discharge characteristic does not match said precharge characteristic.

2. Apparatus as claimed in claim 1, wherein said discharging circuitry comprises a memory bit cell configured to store said data value and said node comprises a bit line coupled to said memory bit cell and configured to be selectively discharged to read said data value from said memory cell, said discharge characteristic being a voltage level of said bit line.

3. Apparatus as claimed in claim 2, comprising a bit line pair coupled to said memory bit cell and wherein said data value stored in said memory bit cell determines which bit line of said bit line pair is discharged during said discharge phase and said precharge characteristic is measured as a difference in a characteristic between said bit line pair during said precharge.

4. Apparatus as claimed in claim 1, wherein said precharge characteristic comprises at least one of:
   a precharge current magnitude flowing to said node during said precharge phase;
   charge magnitude passing to said node during said precharge phase; and
   a time taken for a voltage at said node to change by a predetermined amount during said precharge phase.

5. Apparatus as claimed in claim 3, wherein said precharge characteristic comprises at least one of:
   a difference in precharge current magnitude flowing to said bit lines of said bit line pair during said precharge phase;
   a difference in charge magnitude passing to said bit lines of said bit line pair during said precharge phase; and
   a difference in a time taken for a voltage at said bit lines of said bit lines of said bit line pair to change by a predetermined amount during said precharge phase.

6. Apparatus as claimed in claim 1, comprising operating parameter adjusting circuitry coupled to said validation circuitry and configured to respond to said operation error detected by said validation circuitry to change an operating parameter of said integrated circuit.

7. Apparatus as claimed in claim 6, wherein said operating parameter comprises at least one of:
   an internal timing parameter of said integrated circuit;
   an operating voltage of said integrated circuit; and
   an operating frequency of said integrated circuit.

8. Apparatus as claimed in claim 2, comprising
   operating parameter adjusting circuitry coupled to said validation circuitry and configured to respond to said operation error detected by said validation circuitry to change an operating parameter of said integrated circuit, and
   a sense amplifier coupled to said bit line to read said data value, wherein
   said operating parameter is a time after a start of said discharge phase at which said sense amplifier reads said data value.

9. Apparatus as claimed in claim 1, wherein said discharging circuitry comprises domino logic circuitry coupled to said node and configured to selectively discharge said node in dependence upon one of more input values supplied to said domino logic circuitry.

10. Apparatus as claimed in claim 1, comprising error recovery circuitry coupled to said validation circuitry and configured to respond to said operation error detected by said validation circuitry to trigger an error recovery operation to correct one or more incorrect processing operations based upon said data value read during said discharge phase.

11. Apparatus as claimed in claim 1, wherein said discharging circuitry, said precharging circuitry, said sensing circuitry and said validating circuitry are all part of an integrated circuit.

12. Apparatus as claimed in claim 1, wherein said node is a signal line configured to pass through a through silicon via to provide signal communication between separate integrated circuit dies.

13. Apparatus as claimed in claim 1, wherein said node is one of a pair of signal lines configured to provide differential value signalling between separate integrated circuits.

14. Apparatus for processing data comprising:
discharging means for selectively discharging a node from a precharge voltage during a discharge phase to represent a data value;
precharging means for precharging said node to said precharge voltage during a precharge phase;
sensing means for detecting during said discharge phase a discharge characteristic of said discharge to determine said data value; and
validation means for detecting during said precharge phase a precharge characteristic of said precharge and for comparing said discharge characteristic to said precharge characteristic to identify an operation error when said discharge characteristic does not match said precharge characteristic.

15. A method of operating an Apparatus for processing data comprising the steps of:
selectively discharging a node from a precharge voltage during a discharge phase to represent a data value;
precharging said node to said precharge voltage during a precharge phase;
detecting during said discharge phase a discharge characteristic of said discharge to determine said data value;
detecting during said precharge phase a precharge characteristic of said precharge; and
comparing said discharge characteristic to said precharge characteristic to identify an operation error when said discharge characteristic does not match said precharge characteristic.

16. A method as claimed in claim 15, wherein said discharging comprises selectively discharging a bit line of a memory bit cell to read a data value from said memory cell, said discharge characteristic being a voltage level of said bit line.

17. A method as claimed in claim 16, comprising selectively discharging a bit line pair coupled to said memory bit cell and wherein said data value stored in said memory bit cell determines which bit line of said bit line pair is discharged during said discharge phase and said precharge characteristic is measured as a difference in a characteristic between said bit line pair during said precharge.

18. A method as claimed in claim 15, wherein said precharge characteristic comprises at least one of:
a precharge current magnitude flowing to said node during said precharge phase;
charge magnitude passing to said node during said precharge phase; and
a time taken for a voltage at said node to change by a predetermined amount during said precharge phase.

19. A method as claimed in claim 17, wherein said precharge characteristic comprises at least one of:
a difference in precharge current magnitude flowing to said bit lines of said bit line pair during said precharge phase;
a difference in charge magnitude passing to said bit lines of said bit line pair during said precharge phase; and
a difference in a time taken for a voltage at said bit lines of said bit lines of said bit line pair to change by a predetermined amount during said precharge phase.

20. A method as claimed in claim 15, comprising responding to said operation error by changing an operating parameter of said integrated circuit.

21. A method as claimed in claim 20, wherein said operating parameter comprises at least one of:
an internal timing parameter of said integrated circuit;
an operating voltage of said integrated circuit; and
an operating frequency of said integrated circuit.

22. A method as claimed in claim 16, comprising responding to said operation error by changing an operating parameter of said integrated circuit, said operating parameter being a time after a start of said discharge phase at which a sense amplifier reads said data value from said bit line.

23. A method as claimed in claim 15, wherein said discharging comprises selectively discharging said node using domino logic in dependence upon one of more input values supplied to said domino logic circuitry.

24. A method as claimed in claim 15, comprising triggering an error recovery operation to correct one or more incorrect processing operations based upon said data value read during said discharge phase.

25. A method as claimed in claim 15, wherein said discharging, said precharging, said sensing and said validating are all performed on an integrated circuit.

26. A method as claimed in claim 15, wherein said node is a signal line passing through a through silicon via to provide signal communication between separate integrated circuit dies.

27. A method as claimed in claim 15, wherein said node is one of a pair of signal lines providing differential value signalling between separate integrated circuits.

* * * * *